US008643161B2

(12) United States Patent
Hasegawa (10) Patent No.: US 8,643,161 B2
(45) Date of Patent: Feb. 4, 2014

(54) SEMICONDUCTOR DEVICE HAVING DOUBLE SIDE ELECTRODE STRUCTURE

(75) Inventor: Hidenori Hasegawa, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/176,256

(22) Filed: Jul. 5, 2011

(65) Prior Publication Data

US 2011/0260334 A1 Oct. 27, 2011

Related U.S. Application Data

(63) Continuation of application No. 12/219,181, filed on Jul. 17, 2008, now Pat. No. 8,053,275.

(30) Foreign Application Priority Data

Jul. 17, 2007 (JP) .................................. 2007-185710

(51) Int. Cl.
*H01L 23/02* (2006.01)

(52) U.S. Cl.
USPC ........... 257/678; 257/778; 257/791; 257/783; 438/106; 438/108; 438/127

(58) Field of Classification Search
USPC ......... 257/678, 685, 686, 723, 773, 774, 776, 257/777, 778, 787, 790, 698, 737, 738, 791, 257/792, 793, 782, 783, 784, 786, 734, 257/788; 438/108, 109, 110, 125, 126, 127, 438/106, 107, 612, 613, 614, 124
See application file for complete search history.

(56) References Cited

U.S. PATENT DOCUMENTS

| 7,084,513 B2 * | 8/2006 | Matsuki et al. ............... 257/777 |
| 7,364,948 B2 | 4/2008 | Lai et al. | |
| 2001/0026010 A1 * | 10/2001 | Horiuchi et al. ............. 257/678 |
| 2002/0060361 A1 * | 5/2002 | Sasaki ........................... 257/698 |
| 2002/0117743 A1 * | 8/2002 | Nakatani et al. ............. 257/687 |
| 2004/0160752 A1 | 8/2004 | Yamashita et al. | |
| 2005/0001331 A1 * | 1/2005 | Kojima et al. ................ 257/778 |
| 2005/0046001 A1 | 3/2005 | Warner | |

(Continued)

FOREIGN PATENT DOCUMENTS

| JP | 11-067975 A | 3/1999 |
| JP | 2002-158312 | 5/2002 |
| JP | 2003-249604 | 9/2003 |
| JP | 2004-119863 A | 4/2004 |
| JP | 2005-235824 | 9/2005 |
| JP | 2006-253281 A | 9/2006 |

OTHER PUBLICATIONS

Office Action for Japanese Patent Application 2007-185710, Japan Patent Office, Oct. 2, 2012.

*Primary Examiner* — Thanh Y Tran
(74) *Attorney, Agent, or Firm* — Kubotera & Associates, LLC (57) ABSTRACT

A semiconductor device includes a package substrate having a front surface and a backside surface; an electrode pad formed on the front surface; an outer connection pad formed on the backside surface and electrically connected to the electrode pad; a semiconductor chip mounted on the front surface and having an electrode electrically connected to the electrode pad; a sealing resin layer having a through hole formed with a die-molding and reaching the electrode pad for sealing the semiconductor chip; and a through electrode filled in the through hole with a conductive material and having one end portion electrically connected to the electrode pad and the other end portion exposed from the sealing resin layer.

5 Claims, 11 Drawing Sheets

(56) References Cited

U.S. PATENT DOCUMENTS

| | | |
|---|---|---|
| 2006/0145328 A1* | 7/2006 | Hsu ............................... 257/690 |
| 2006/0290011 A1 | 12/2006 | Cobbley et al. |
| 2007/0056766 A1* | 3/2007 | Sunohara ..................... 174/260 |
| 2007/0181989 A1 | 8/2007 | Corisis et al. |
| 2008/0136004 A1* | 6/2008 | Yang et al. .................... 257/686 |
| 2008/0265412 A1* | 10/2008 | Hasegawa ..................... 257/737 |
| 2008/0315415 A1* | 12/2008 | Ino ................................ 257/737 |

* cited by examiner

SEMICONDUCTOR DEVICE HAVING DOUBLE SIDE ELECTRODE STRUCTURE

CROSS-REFERENCE TO RELATED APPLICATIONS

This is a continuation application of a prior application Ser. No. 12/219,181, filed Jul. 17, 2008 now U.S. Pat. No. 8,053,275.

BACKGROUND OF THE INVENTION AND RELATED ART STATEMENT

The present invention relates to a semiconductor device. In particular, the present invention relates to a semiconductor device having a double side electrode structure.

Recently, in order to reduce a size of an electric device such as a cellular phone, a three-dimensional package technology has been developed to increase a mount density. Among the three-dimensional package technologies, a package-on-package (POP) technology, in which one package is laminated on another package, has been considered promising.

In the POP, a package having a double side electrode structure (a double side electrode package or a dual face package) has been used. In the double side electrode package, it is necessary to provide an inner wiring portion connected to a semiconductor chip; a through electrode for connecting an electrode on a package front surface and the inner wiring portion; and a through electrode for connecting an electrode on a package backside surface and the inner wiring portion.

A variety of double side electrode packages having various structures have been proposed. For example, Patent Reference 1 has disclosed a double side electrode package of a lead frame type. In the double side electrode package disclosed in Patent Reference 1, an inner lead with a step portion is used. A part of the inner lead is exposed from a resin sealing portion, and a front surface and a backside surface of the inner lead are used as outer electrodes. In the double side electrode package, the inner lead functions as a through electrode.

Patent Reference 2 has disclosed a double side electrode package of a ball grid array (BGA) type. In the double side electrode package disclosed in Patent Reference 2, a package substrate is provided with a step portion. An end portion of a wire bonding electrode is exposed from the step portion. A through electrode passes through the package substrate for connecting the end portion and an electrode on a front surface or a backside surface.

In order to mount elements with a high density using the double side electrode packages described above, it is necessary to reduce a thickness of each package. For example, in the double side electrode package disclosed in Patent Reference 1, the inner lead is provided with the step portion as a recess portion for accommodating a semiconductor chip, thereby reducing a thickness of the package. In the double side electrode package disclosed in Patent Reference 2, the package substrate is provided with the step portion. Further, the package substrate is mechanically ground from a backside surface thereof, thereby reducing a thickness of the package.

Patent Reference 3 has disclosed a double side electrode package of a resin sealing type. In the double side electrode package disclosed in Patent Reference 3, a through hole is formed in a sealing resin layer with a semiconductor chip sealed therein. The through hole is filled with a solder paste to form a through electrode for connecting an electrode on a front surface and an inner wiring portion. In the double side electrode package, the through electrode is formed in the sealing resin layer. Accordingly, it is not necessary to provide a recess portion in a package substrate.

Patent Reference 1: Japanese Patent Publication No. 2003-249604
Patent Reference 2: Japanese Patent Publication No. 2005-235824
Patent Reference 3: Japanese Patent Publication No. 2002-158312

In the double side electrode package disclosed in Patent Reference 3, it is necessary to accurately form the through hole in each package through laser radiation and the likes, thereby making a manufacturing process thereof complicated.

In view of the problems described above, an object of the present invention is to provide a semiconductor device and a method of producing the semiconductor device capable of solving the problems of the conventional semiconductor devices. In the method of producing the semiconductor device, it is possible to easily produce a double side electrode package without performing a complicated process such as forming the recess portion in the package substrate or forming a large number of the through holes through laser radiation.

Further objects and advantages of the invention will be apparent from the following description of the invention.

SUMMARY OF THE INVENTION

In order to attain the objects described above, according to a first aspect of the present invention, a semiconductor device includes a package substrate having a front surface and a backside surface; an electrode pad formed on the front surface; an outer connection pad formed on the backside surface and electrically connected to the electrode pad; a semiconductor chip mounted on the front surface and having an electrode electrically connected to the electrode pad; a sealing resin layer having a through hole formed with a die-molding and reaching the electrode pad for sealing the semiconductor chip; and a through electrode filled in the through hole with a conductive material and having one end portion electrically connected to the electrode pad and the other end portion exposed from the sealing resin layer.

According to a second aspect of the present invention, a method of producing a semiconductor device includes the steps of:

preparing a substrate frame to be divided into a package substrate;

forming an electrode pad on a front surface of the package substrate;

forming an outer connection pad on a backside surface of the package substrate so that the outer connection pad is electrically connected to the electrode pad;

mounting a semiconductor chip on the front surface so that an electrode of the semiconductor chip is electrically connected to the electrode pad;

molding a sealing resin layer with a metal die having a protrusion with a column shape contacting with the electrode pad while the metal die is pressed against a surface of the substrate frame so that the sealing resin layer includes a through hole reaching the electrode pad and seals the semiconductor chip;

filling the through hole with a conductive material to form a through electrode having one end portion electrically connected to the electrode pad and the other end portion exposed from the sealing resin layer; and scribing the substrate frame to divide the substrate frame into the package substrate accommodating the semiconductor chip, and having the electrode pad, the outer connection pad, the through electrode, and the sealing resin layer formed thereon.

According to a third aspect of the present invention, the semiconductor device in the first aspect may further includes a re-distribution pad formed on a surface of the sealing resin layer and a connection wiring portion formed on the surface of the sealing resin layer for electrically connecting the other end of the through electrode and the re-distribution pad.

According to a fourth aspect of the present invention, a method of producing a semiconductor device includes the steps of:

preparing a substrate frame to be divided into a package substrate;

forming an electrode pad on a front surface of the package substrate;

forming an outer connection pad on a backside surface of the package substrate so that the outer connection pad is electrically connected to the electrode pad;

mounting a semiconductor chip on the front surface so that an electrode of the semiconductor chip is electrically connected to the electrode pad;

molding a sealing resin layer with a metal die having a protrusion with a column shape contacting with the electrode pad while the metal die is pressed against a surface of the substrate frame so that the sealing resin layer includes a through hole reaching the electrode pad and seals the semiconductor chip;

filling the through hole with a conductive material to form a through electrode having one end portion electrically connected to the electrode pad and the other end portion exposed from the sealing resin layer;

forming a re-distribution pad on a surface of the sealing resin layer;

forming a connection wiring portion on the surface of the sealing resin layer for electrically connecting the other end of the through electrode and the re-distribution pad; and scribing the substrate frame to divide the substrate frame into the package substrate accommodating the semiconductor chip, and having the electrode pad, the outer connection pad, the through electrode, the sealing resin layer, the re-distribution pad, and the connection wiring portion formed thereon.

According to a fifth aspect of the present invention, in the method of producing the semiconductor device in one of the second aspect and the fourth aspect, the through hole is formed at a plurality of locations surrounding the semiconductor chip. Further, the protrusion with the column shape may be integrated with the metal die, or be formed of a pin inserted into the metal die.

In the present invention, it is possible to easily produce a double side electrode package without performing a complicated process such as forming a recess portion in a package substrate or forming a large number of through holes through laser radiation.

BRIEF DESCRIPTION OF THE DRAWINGS

FIGS. 1(A) and 1(B) are schematic views showing a double side electrode package according to an embodiment of the present invention, wherein

FIGS. 2(A) to 2(C) are schematic views showing a package substrate according to the embodiment of the present invention, wherein

FIGS. 3(A) and 3(B) are schematic views showing a substrate frame in a preparation step according to the embodiment of the present invention, wherein

FIGS. 4(A) and 4(B) are schematic views showing the substrate frame in a step of mounting semiconductor chips according to the embodiment of the present invention, wherein

FIGS. 7(A) and 7(B) are schematic views showing the substrate frame after a step of sealing with a resin according to the embodiment of the present invention, wherein

FIGS. 8(A) and 8(B) are schematic views showing the substrate frame after a step of attaching a metal mask according to the embodiment of the present invention, wherein

FIGS. 9(A) and 9(B) are schematic views showing the substrate frame in a step of forming through electrodes according to the embodiment of the present invention, wherein

FIGS. 10(A) and 10(B) are schematic views showing the substrate frame in a step of forming re-distribution pads according to the embodiment of the present invention, wherein FIGS. 11(A) and 11(B) are schematic views showing the substrate frame in a step of scribing the substrate frame according to the embodiment of the present invention, wherein

DETAILED DESCRIPTION OF PREFERRED EMBODIMENTS

Hereunder, embodiments of the present invention will be explained with reference to the accompanying drawings. In the following description of the present invention, each of the drawings is illustrated schematically in terms of a shape, a size, and a dimensional relationship for explaining the embodiments of the present invention, and the present invention is not limited to the shape, the size, and the dimensional relationship shown in the drawings.

Figure 1A:
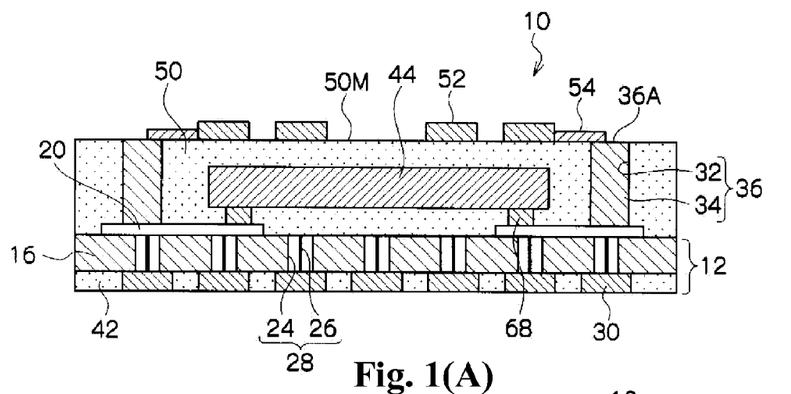
FIG. 1(A) is a schematic sectional view of the double side electrode package taken along a line 1(A)-1(A) in FIG. 1(B)
Figure 1B:
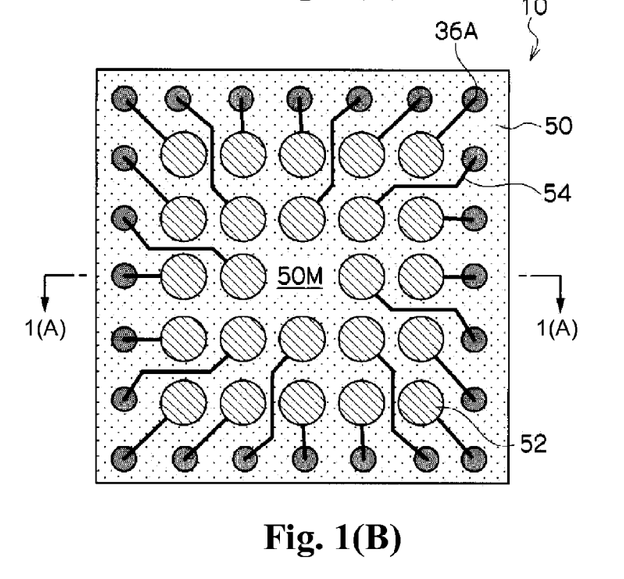
FIG. 1(B) is a plan view of the double side electrode package viewed from a front surface thereof.

FIGS. 1(A) and 1(B) are schematic views showing a double side electrode package 10 according to an embodiment of the present invention. The double side electrode package is also referred to as a dual face package. More specifically, FIG. 1(A) is a schematic sectional view of the double side electrode package 10 taken along a line 1(A)-1(A) in FIG. 1(B), and FIG. 1(B) is a plan view of the double side electrode package 10 viewed from a front surface thereof.

In the embodiment, the double side electrode package 10 includes a core member 16 formed of an insulation member such as a resin and a ceramic in a plate shape. A plurality of wiring portions 20 having a specific pattern is formed on a front surface of the core member 16. The wiring portion 20 corresponds to an electrode pad.

In the embodiment, the wiring portion 20 has one end portion as a bonding pad for connecting to a semiconductor chip 44 such as an LSI (Large Scale Integrated circuit) and the likes. Further, the wiring portion 20 has the other end portion as a connection pad on a front surface side for connecting a through electrode 28. A plurality of bias 24 is formed in the core member 16 to pass therethrough. A conductive material 26 is filled in each of the bias 24 to form the through electrode 28.

In the embodiment, one end portion of the through electrode 28 is exposed from the front surface of the core member 16, and the other end portion of the through electrode 28 is exposed from a backside surface of the core member 16. A plurality of connection pads 30 is formed on the backside surface of the core member 16 to cover the exposed portions of the through electrodes 28. The one end portion of the through electrode 28 exposed from the surface of the core member 16 is electrically connected to the wiring portion 20. The other end portion of the through electrode 28 exposed from the front surface of the core member 16 is electrically connected to the electrode pad 30. A solder resist 42 is provided for covering the backside surface of the core member 16 except the connection pads 30.

Figure 2A:
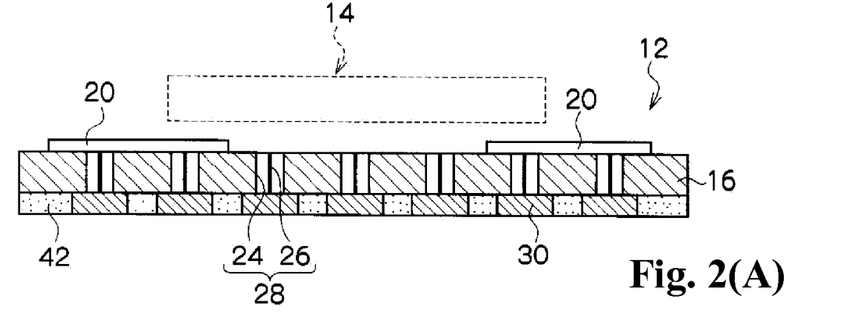
FIG. 2(A) is a schematic sectional view of the package substrate.
Figure 2B:
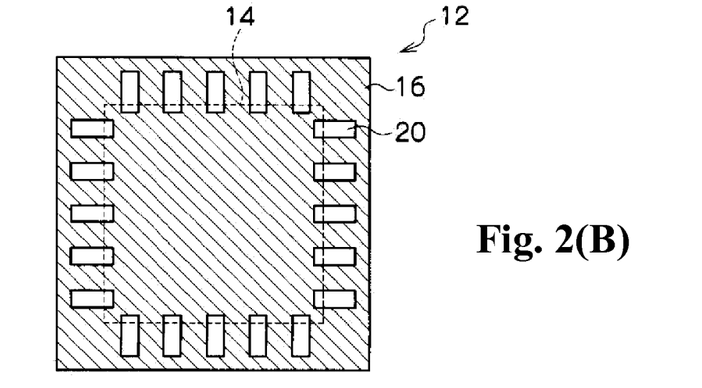
FIG. 2(B) is a plan view of the package substrate viewed from a front surface thereof.
Figure 2C:
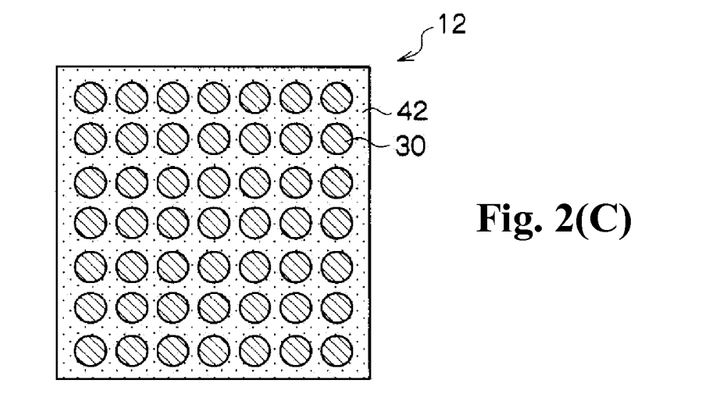
FIG. 2(C) is a plan view of the package substrate viewed from a backside surface thereof.

FIGS. 2(A) to 2(C) are schematic views showing a package substrate 12 according to the embodiment of the present invention. More specifically, FIG. 2(A) is a schematic sectional view of the package substrate 12, FIG. 2(B) is a plan view of the package substrate 12 viewed from a front surface thereof, and FIG. 2(C) is a plan view of the package substrate 12 viewed from a backside surface thereof.

As shown in FIG. 2(A), the package substrate 12 is formed of the core member 16, the wiring portions 20, the through electrodes 28, the connection pads 30, and the solder resist 42. A chip installation area 14 is defined on the surface of the core member 16 as indicated by a hidden line in FIG. 2(B), so that the semiconductor chip 44 is placed in the chip installation area 14. Further, the wiring portions 20 are arranged to cover an outer circumferential edge of the chip installation area 14.

As shown in FIG. 2(B), the chip installation area 14 has a rectangular shape in a plan view, and has a size larger than that of the semiconductor chip 44 in a plan view. In the embodiment, 24 of the wiring portions 20 are arranged on the surface of the core member 16 (among 24, 20 are shown in FIG. 2(B), and 4 are not shown).

In the embodiment, 49 of the connection pads 30 are disposed on the backside surface of the package substrate 12. The numbers and arrangements of the wiring portions 20 and the connection pads 30 may be adjusted according to the number of electrodes of the semiconductor chip 44 and the likes.

As shown in FIG. 1(A), the LSI chip such as the semiconductor chip 44 is disposed with a surface thereof facing downwardly in the chip installation area 14 (refer to FIG. 2(B)). An electrode (not shown) formed on the surface of the semiconductor chip 44 is directly connected to one of the wiring portions 20 with a bump 68 formed of a metal such as solder.

More specifically, the semiconductor chip 44 is connected to the package substrate 12 through a flip-chip connection with end portions of the wiring portions 20 as bonding pads.

In the embodiment, the semiconductor chip 44 and the bumps 68 are sealed with a sealing resin layer 50. The sealing resin layer 50 covers a surrounding of the semiconductor chip 44. The sealing resin layer 50 is molded through mold forming (die-molding), so that a plurality of through holes 32 is formed to pass through the sealing resin layer 50 and reach the wiring portions 20 (described later). A portion of each of the wiring portions 20 is exposed at a bottom portion of each of the through holes 32 as the connection pad on the front surface side.

In the embodiment, a conductive material 34 is filled in each of the conductive material 34 to form a through electrode 36. One end portion of the through electrode 36 is exposed from the surface of the sealing resin layer 50 as an end surface 36A, and the other end portion of the through electrode 36 is electrically connected to the wiring portion 20. Accordingly, the through electrodes 36 with a circular column shape are arranged in the sealing resin layer 50 in a rectangular shape surrounding the chip installation area 14 (refer to FIG. 2(B)).

In the embodiment, 24 of the through electrodes 36 are disposed. The number and the arrangement of the through electrodes 36 may be adjusted according to the number of the electrodes of the semiconductor chip 44 and the likes.

As shown in FIG. 1(A), a plurality of re-distribution pads 52 is formed on a surface 50M of the sealing resin layer 50. As shown in FIG. 1(B), 24 of the re-distribution pads 52 are arranged in a 5×5 matrix pattern except a center point. The number and the arrangement of the re-distribution pads 52 may be adjusted according to the number of the through electrodes 36 and easiness of connection to a package at an upper side.

As described above, in the embodiment, 24 of the through electrodes 36 are disposed around the chip installation area 14, and 24 of the end surfaces 36A are exposed from the surface 50M of the sealing resin layer 50. Wiring portions 54 are disposed on the surface 50M of the sealing resin layer 50 for individually connecting the end surfaces 36A of the through electrodes 36 and the re-distribution pads 52, thereby re-distributing on the front surface of the double side electrode package 10.

A method of producing the double side electrode package 10 will be explained next. FIGS. 3(A)-3(B) to 11(A)-11(B) are schematic views showing a manufacturing process of the double side electrode package 10. In the manufacturing process, a substrate frame 60 with a plurality of the package substrates 12 formed thereon is used.

In the embodiment, the double side electrode package 10 is formed on the substrate frame 60 per each of the package substrates 12. In a final step, the substrate frame 60 is scribed to divide into each of the double side electrode packages 10 individually. The method of producing the double side electrode package 10 will be explained in order.

Figure 3A:
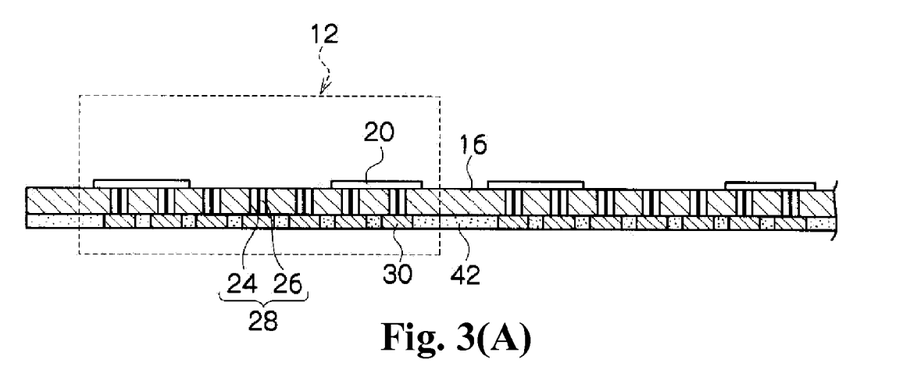
FIG. 3(A) is a schematic partially sectional view of the substrate frame.
Figure 3B:
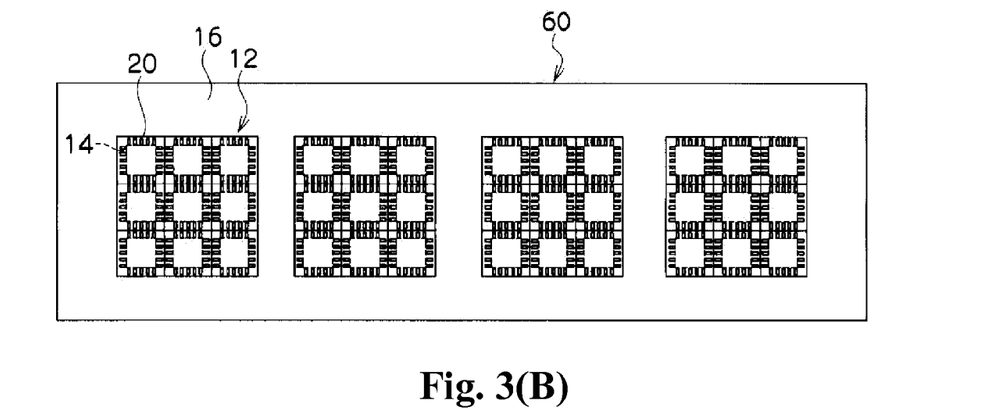
FIG. 3(B) is a plan view of the substrate frame viewed from a front surface thereof.

First, the substrate frame 60 with a plurality of the package substrates 12 formed thereon is prepared. FIGS. 3(A) and 3(B) are schematic views showing the substrate frame 60 in a preparation step according to the embodiment of the present invention. More specifically, FIG. 3(A) is a schematic partially sectional view of the substrate frame 60, and FIG. 3(B) is a plan view of the substrate frame 60 viewed from a front surface thereof.

As described above, a plurality of the package substrates 12 is formed on the substrate frame 60. In the embodiment, as shown in FIG. 3(B), 36 of the package substrates 12 are formed on the substrate frame 60. The package substrates 12 are divided into four group of nine. In each group, nine of the package substrates 12 are arranged in a 3×3 matrix pattern. The groups are arranged along a longitudinal direction of the substrate frame 60 with a specific interval inbetween. In FIG. 3(A), only two of the package substrates 12 are shown. An area surrounded with a hidden line represents one package substrate 12 shown in FIGS. 2(A) to 2(C).

In the embodiment, the substrate frame 60 includes the core member 16 having a flat plate shape. A plurality of the wiring portions 20, a plurality of the through electrodes 28, a plurality of the connection pads 30, and the solder resist 42 are formed in the core member 16. A plurality of the wiring portions 20 is arranged in a rectangular shape surrounding the chip installation area 14 of the package substrate 12. Each of the wiring portions 20 is configured in a specific pattern, so that the one end portion thereof functions as the bonding pad for connecting to the semiconductor chip 44, and the other end portion thereof functions as the connection pad on the front surface side for connecting to the through electrode 28.

In the embodiment, the core member 16 and the solder resist 42 are formed of an insulating material such as, preferably, an organic resin. The conductive members such as the wiring portions 20, the conductive material 26 filled in the bias 24 of the through electrodes 28, the connection pads 30, and the likes are formed of a conductive material such as, preferably, copper (Cu) with a low electric resistivity.

Figure 4A:
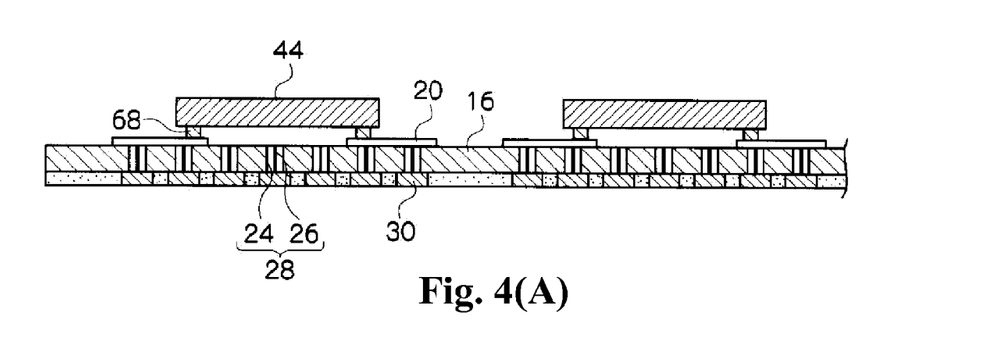
FIG. 4(A) is a schematic partially sectional view of the substrate frame.
Figure 4B:
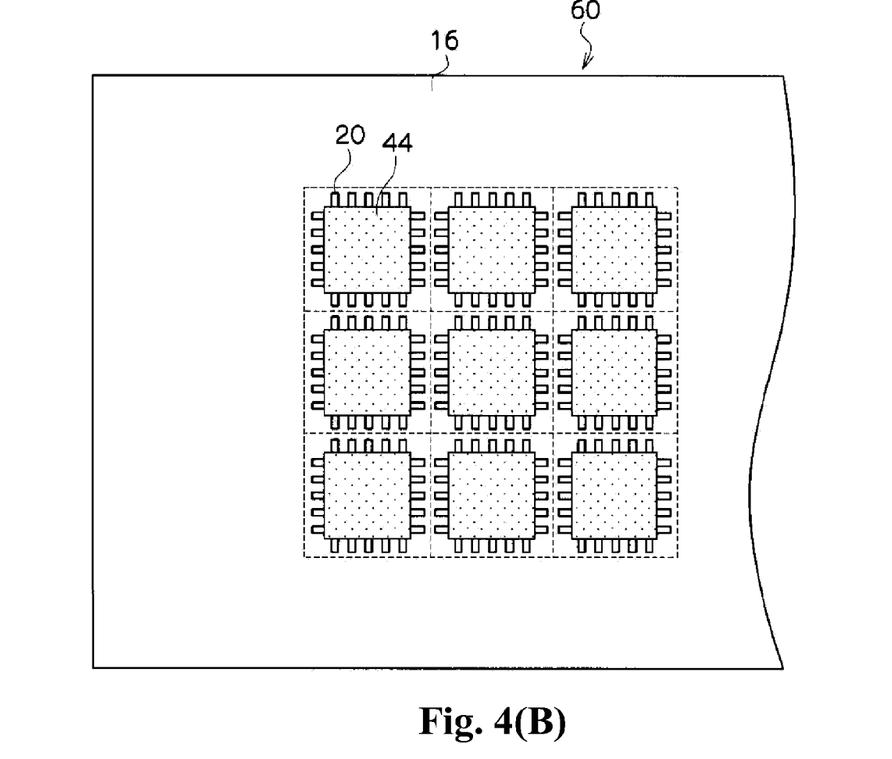
FIG. 4(B) is a plan view of the substrate frame viewed from the front surface thereof.

In the next step, the semiconductor chip 44 is mounted in the chip installation area 14 of the package substrate 12. FIGS. 4(A) and 4(B) are schematic views showing the substrate frame 60 in a step of mounting the semiconductor chips 44 according to the embodiment of the present invention. More specifically, FIG. 4(A) is a schematic partially sectional view of the substrate frame 60, and FIG. 4(B) is a plan view of the substrate frame viewed 60 from the front surface thereof.

In the embodiment, a plurality of identical circuits is formed on a semiconductor wafer, and the semiconductor wafer is divided (dicing) into an individual circuit to produce the semiconductor chip 44 such as an IC chip and an LSI chip. A plurality of the electrodes (not shown) is disposed on a surface of the semiconductor chip 44.

In the embodiment, the semiconductor chip 44 is mounted in the chip installation area 14 of the package substrate 12 with the surface thereof facing downwardly. Accordingly, a plurality of the electrodes (not shown) disposed on the surface of the semiconductor chip 44 is directly connected to the wiring portions 20 with the bumps 60. That is, the semiconductor chip 44 is connected to the package substrate 12 through the flip-flop connection. Similarly, the semiconductor chip 44 is mounted in the chip installation area 14 of the package substrate 12 arranged at a next location on the substrate frame 60.

Figure 5:
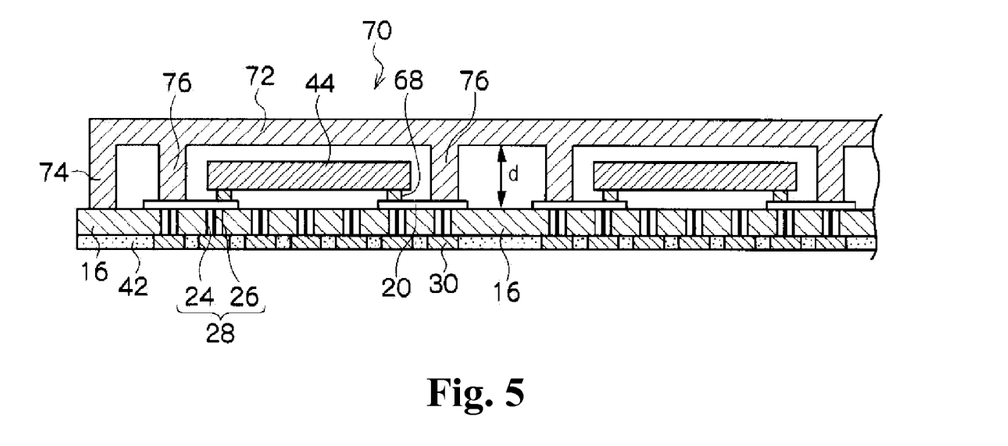
FIG. 5 is a schematic sectional view showing the substrate frame in a state that the substrate frame is placed in a metal die according to the embodiment of the present invention.
Figure 6A:
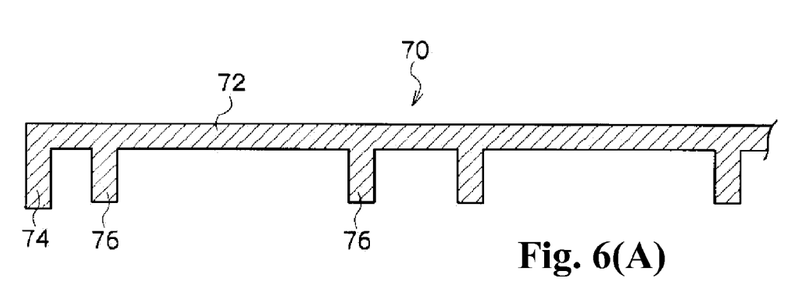
FIGS. 6(A) and 6(B) are schematic partially sectional views showing the metal die according to the embodiment of the present invention.
Figure 6B:
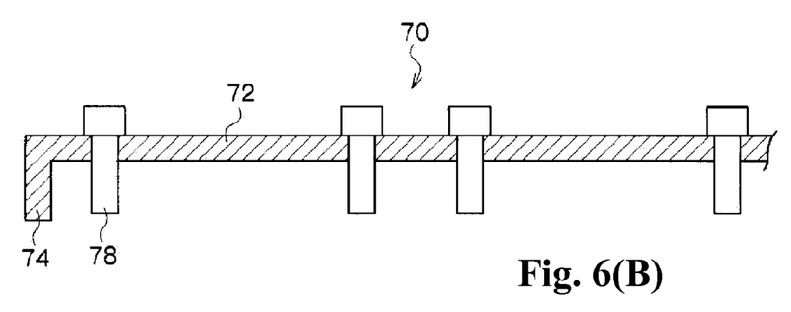
Figure 7A:
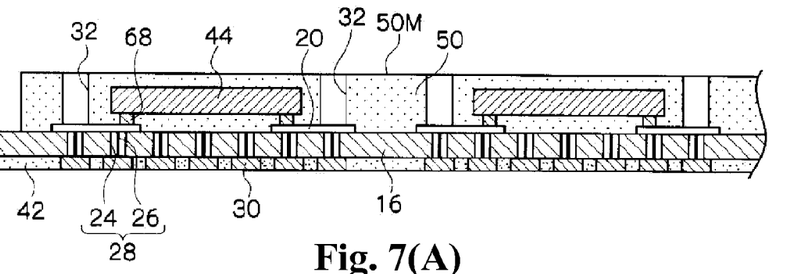
FIG. 7(A) is a schematic partially sectional view of the substrate frame.
Figure 7B:
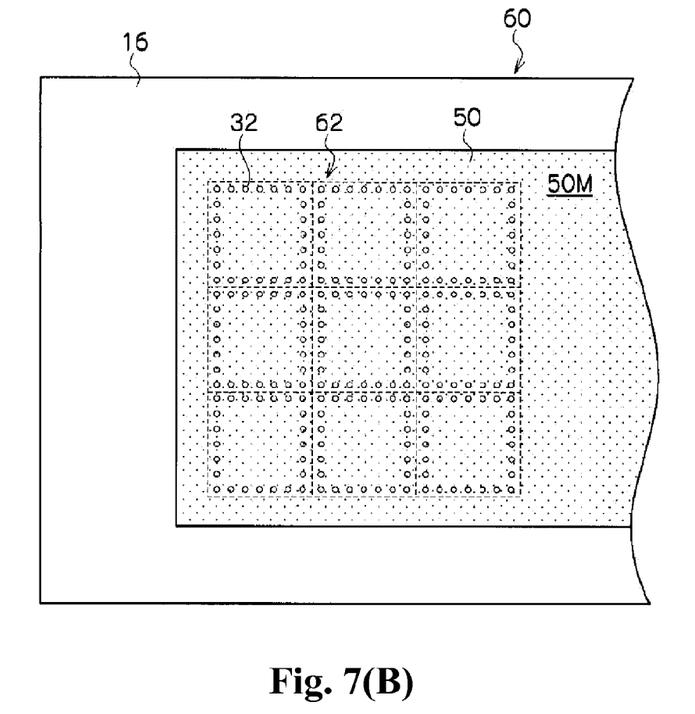
FIG. 7(B) is a plan view of the substrate frame viewed from the front surface thereof.

In the next step, the semiconductor chip 44 is sealed with a sealing resin. FIG. 5 is a schematic sectional view showing the substrate frame 60 in a state that the substrate frame 60 is placed in a metal die 70 according to the embodiment of the present invention. FIGS. 6(A) and 6(B) are schematic partially sectional views showing the metal die 70 according to the embodiment of the present invention. FIGS. 7(A) and 7(B) are schematic views showing the substrate frame 60 after a step of sealing with the sealing resin according to the embodiment of the present invention. More specifically, FIG. 7(A) is a schematic partially sectional view of the substrate frame, and FIG. 7(B) is a plan view of the substrate frame 60 viewed from the front surface thereof. Note that the substrate frame 60 shown in FIG. 7(B) includes the group of the package substrates 12 (nine package substrates).

As shown in FIG. 5, in the step of sealing with the sealing resin, the semiconductor chip 44 is placed in the chip installation area 14 of the substrate frame 60, and the substrate frame 60 is set in the metal die 70 for transfer molding. When the substrate frame 60 is set in the metal die 70, an enclosed space is formed between the metal die 70 and the substrate frame 60. The sealing resin is injected into and filled in the space through an inlet (not shown), so that the sealing resin layer 50 covers the surface of the substrate frame 60. The sealing resin preferably includes an epoxy resin.

In the embodiment, the metal die 70 is formed of a flat plate portion 72 disposed to face the substrate frame 60; an outer frame portion 74 disposed along an outer circumference of the flat plate portion 72; and a plurality of protruding portions 76 having a circular column shape vertically protruding from the flat plate portion 72. The flat plate portion 72 is formed of a flat plate having an elongated shape and a size slightly smaller than that of the substrate frame 60. When the substrate frame 60 is set in the metal die 70, the enclosed space is formed between the flat plate portion 72, the outer frame portion 74, and the substrate frame 60.

In the embodiment, the protruding portions 76 have a height lower than the outer frame portion 74, so that end portions of the protruding portions 76 abut against the portions of the wiring portions 20 to become the connection pads on the front surface side when the substrate frame 60 is set in the metal die 70. With the protruding portions 76, a plurality of the through holes 32 is formed in the sealing resin layer 50 to pass through the sealing resin layer 50 and reach the wiring portions 20. The portions of the wiring portions 20 to become the connection pads on the front surface side are exposed from bottom portions of the through holes 32.

In the embodiment, the sealing resin layer 50 preferably has a thickness two to three times larger than a thickness of the semiconductor chip 44, while the semiconductor chip 44 generally has a thickness of about 50 to 100 μm. Accordingly, it is preferred to design the metal die 70 such that a distance d between an inner surface of the flat plate portion 72 and the substrate frame 60 becomes 0.1 to 0.3 mm when the substrate frame 60 is set in the metal die 70.

As shown in FIG. 6(A), it is possible to integrally form the flat plate portion 72, the outer frame portion 74, and the protruding portions 76 of the metal die 70 through metal molding. Alternatively, as shown in FIG. 6(B), it is possible to integrally form only the flat plate portion 72 and the outer frame portion 74 through metal molding, and pins (flat pins) 78 with stoppers are inserted into the flat plate portion 72 to from the protruding portions.

As shown in FIG. 7(B), a plurality of the package substrates 12 is formed in an area 62 (indicated by a hidden line), and the sealing resin layer 50 covers an area larger than the area 62. After the molding, the substrate frame 60 is removed from the metal die 70, thereby completing the sealing step. When the surface of the substrate frame 60 is covered with the sealing resin layer 50, in addition to the semiconductor chip 44, the bumps 68 are sealed concurrently. Further, the sealing resin layer 50 covers the area larger than the area 62, so that the semiconductor chip 44 arranged in the chip installation area 14 is sealed at one time.

As described above, in the sealing step, a plurality of the through holes 32 passing through the sealing resin layer 50 and reaching the wiring portions 20 is sealed collectively. In the embodiment, 24 of the through holes 32 are formed in the chip installation area 14, and 36 of the package substrates 12 are arranged on the substrate frame 60 (refer to FIG. 3(B)). Accordingly, a total of 864 of the through holes 32 are formed collectively.

Figure 8A:
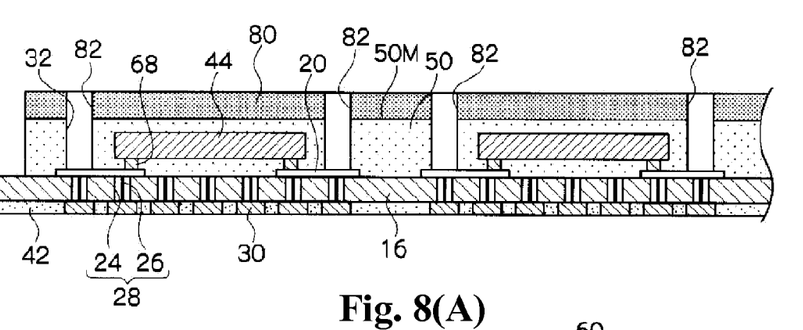
FIG. 8(A) is a schematic partially sectional view of the substrate frame.
Figure 8B:
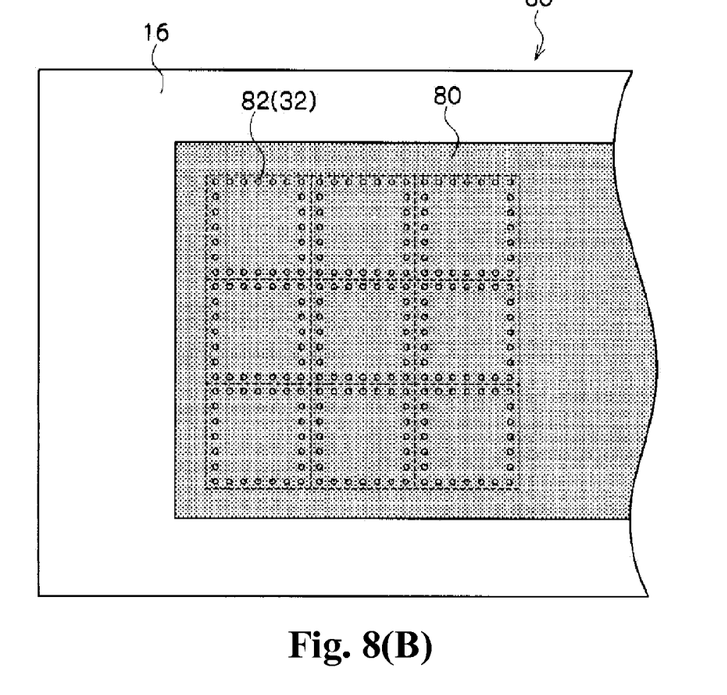
FIG. 8(B) is a plan view of the substrate frame viewed from the front surface thereof.
Figure 9A:
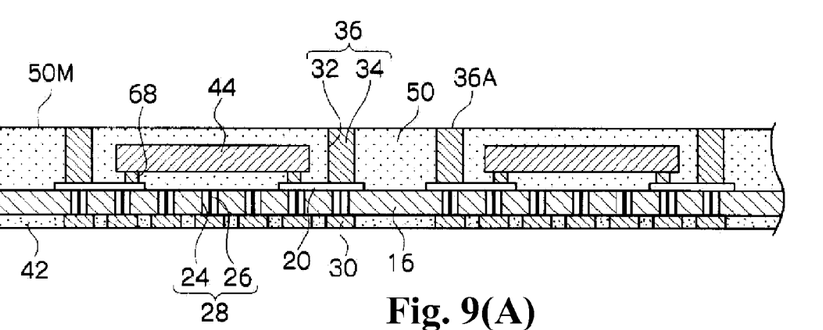
FIG. 9(A) is a schematic partially sectional view of the substrate frame.
Figure 9B:
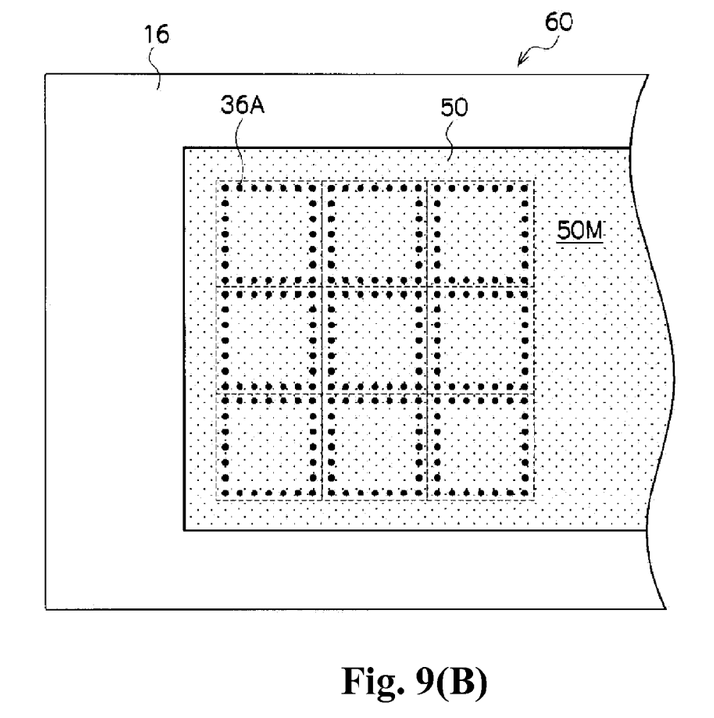
FIG. 9(B) is a plan view of the substrate frame viewed from the front surface thereof.

In the next step, the conductive material 34 is filled in the through holes 32 to form the through electrodes 36. FIGS. 8(A) and 8(B) are schematic views showing the substrate frame 60 after a step of attaching a metal mask 80 according to the embodiment of the present invention. More specifically, FIG. 8(A) is a schematic partially sectional view of the substrate frame 60, and FIG. 8(B) is a plan view of the substrate frame 60 viewed from the front surface thereof. FIGS. 9(A) and 9(B) are schematic views showing the substrate frame in a step of forming the through electrodes 36 according to the embodiment of the present invention. More specifically, FIG. 9(A) is a schematic partially sectional view of the substrate frame 60, and FIG. 9(B) is a plan view of the substrate frame 60 viewed from the front surface thereof.

As shown in FIGS. 8(A) and 8(B), the metal mask 80 is attached to the sealing resin layer 50. A plurality of opening portions 82 corresponding to the through holes 32 is formed in the metal mask 80. Accordingly, the metal mask 80 is positioned, so that the opening portions 82 of the metal mask 80 match to the through holes 32 to become integrated through holes. The conductive material 34 such as a solder past is filled in the through holes 32 through the opening portions 82 of the metal mask 80.

After the conductive material 34 is filled in the through holes 32, the metal mask 80 is removed from the sealing resin layer 50. With the metal mask 80, it is possible to fill the conductive material 34 only in the through holes 32 without attaching the conductive material 34 to the surface 50M of the sealing resin layer 50. It is preferable that the metal mask 80 is formed of a material such as an aluminum thin plate, so that it is possible to accurately form the opening portions 82 and easily remove the metal mask 80 from the sealing resin layer 50.

As shown in FIGS. 9(A) and 9(B), the conductive material 34 is filled in the through holes 32 formed in the sealing resin layer 50 to form the through electrodes 36. The one end portions of the through electrodes 36 are exposed from the surface 50M of the sealing resin layer 50 as the end surfaces 36A, and the other end portions of the through electrodes 36 are electrically connected to the wiring portions 20. In the embodiment, 24 of the end surfaces 36A in the chip installation area 14 are exposed from the surface 50M of the sealing resin layer 50.

Figure 10A:
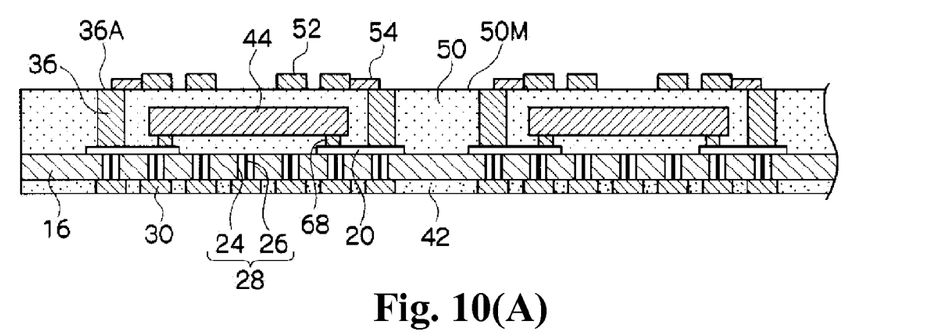
FIG. 10(A) is a schematic partially sectional view of the substrate frame.
Figure 10B:
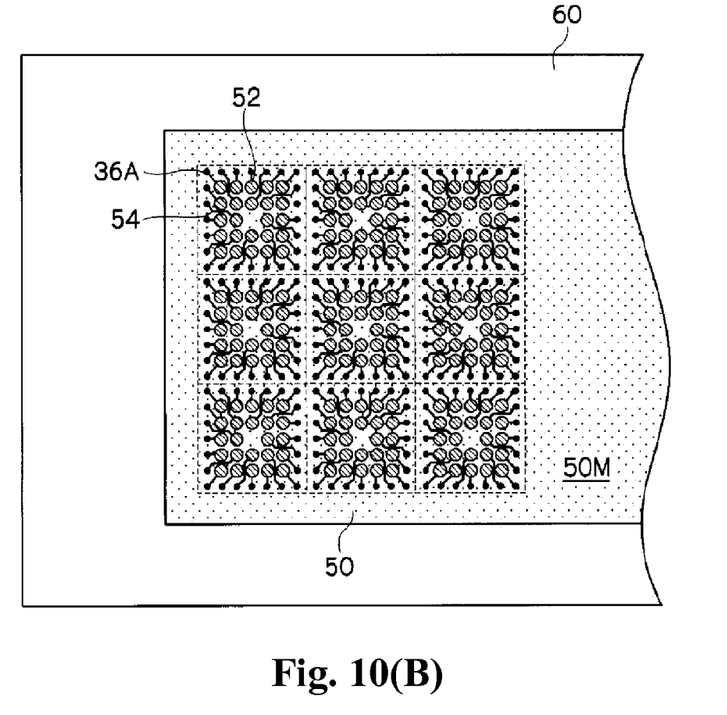
FIG. 10(B) is a plan view of the substrate frame viewed from the front surface thereof.

In the next step, the re-distribution pads 52 are formed on the surface 50M of the sealing resin layer 50. FIGS. 10(A) and 10(B) are schematic views showing the substrate frame 60 in a step of forming the re-distribution pads 52 according to the embodiment of the present invention. More specifically, FIG. 10(A) is a schematic partially sectional view of the substrate frame 60, and FIG. 10(B) is a plan view of the substrate frame 60 viewed from the front surface thereof.

In the embodiment, the re-distribution pads 52 and the wiring portions 54 are formed on the surface 50M of the sealing resin layer 50 in a specific re-distribution pattern using metal nano-particles. The end surfaces 36A of the through electrodes 36 are situated at a level same as that of the surface 50M. Accordingly, it is easy to form the specific re-distribution pattern.

In the embodiment, the re-distribution pattern may be formed through, for example, ink-jet printing using ink containing metal nano-particles or screen printing using a paste containing metal nano-particles. The metal nano-particles are formed of metal particles having a diameter of 1 to 100 μm. The metal nano-particles may include, for example, copper metal nano-particles.

In the embodiment, as described above, 24 of the through electrodes 36 are arranged in the rectangular pattern around the chip installation area 14 (refer to FIG. 2(B)), so that seven of the end surfaces 36A are situated on one side of the rectangular pattern. Further, as shown in FIG. 1(B), according to the number of the end surfaces 36A, it is possible to form 24 of the re-distribution pads 52 on the surface 50M per the chip installation area 14.

In the embodiment, it is possible to arrange (re-distribute) the re-distribution pads 52 on the surface 50M in an arbitrary pattern. For example, in the re-distribution pattern shown in FIG. 1(B), 24 of the re-distribution pads 52 are arranged in the 5×5 matrix pattern except the center point. Further, the wiring portions 54 are formed to connect the end surfaces 36A and the re-distribution pads 52, respectively.

Note that, when ink or a paste containing metal nano-particles is used, it is preferred to perform reduction using hydrogen in an atomic state after the re-distribution pattern is formed, thereby removing stain or an oxidized matter due to an organic solvent and the likes.

Figure 11A:
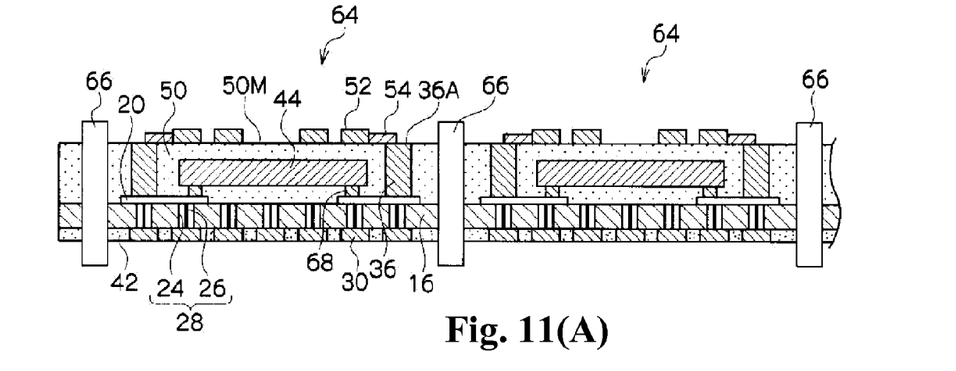
FIG. 11(A) is a schematic partially sectional view of the substrate frame.
Figure 11B:
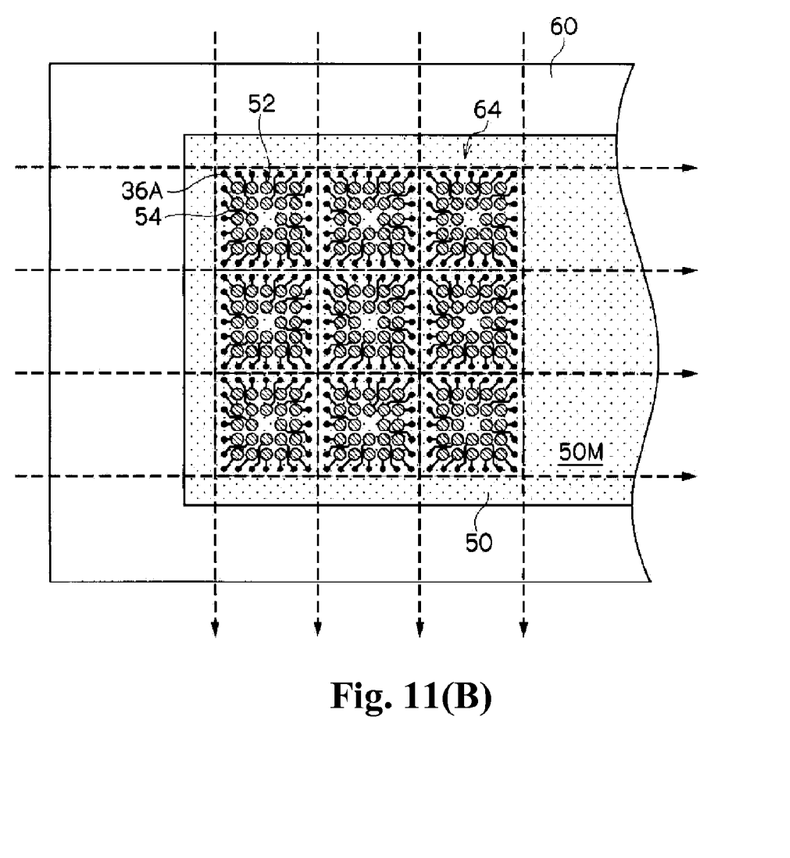
FIG. 11(B) is a plan view of the substrate frame viewed from the front surface thereof.

In the next step, the substrate frame 60 is scribed to obtain the individual package. FIGS. 11(A) and 11(B) are schematic views showing the substrate frame 60 in a step of scribing the substrate frame 60 according to the embodiment of the present invention. More specifically, FIG. 11(A) is a schematic partially sectional view of the substrate frame 60, and FIG. 11(B) is a plan view of the substrate frame 60 viewed from the front surface thereof.

In the embodiment, a plurality of package structures 64 is formed on the substrate frame 60. As shown in FIG. 11(B), nine of the package structures 64 are arranged in a shown area of the substrate frame 60 in a 3×3 matrix pattern. A blade (not shown) moves in an arrow direction to cut the substrate frame 60 in a grid pattern, so that each of the package structures 64 is cut into an individual piece, thereby forming the double side electrode package 10. When the blade cuts the substrate frame 60, blade passing areas 66 of the substrate frame 60 are removed. The blade may include a diamond blade and the likes.

As described above, in the embodiment, the through electrodes 36 are formed to pass through the sealing resin layer 50, so that the wiring portions 20 on the surface of the substrate are electrically connected to the connection pads 30 on the surface of the package. Accordingly, it is not necessary to provide a substrate frame with a step portion. Further, when the semiconductor chip 44 are molded and sealed, the through holes 32 are formed concurrently, and the conductive material 34 is filled in the through holes 32 to form the through electrodes 36. Accordingly, it is not necessary to form a through hole one by one for forming a through electrode. As a result, it is easy to form the semiconductor chip 44, thereby drastically reducing cost.

In the embodiment, it is possible to arrange (re-distribute) the re-distribution pads 52 in an arbitrary pattern, thereby making it easy to connect to the package laminated on the upper portion thereof. Further, the end surfaces 36A of the through electrodes 36 are situated at a level same as that of the surface 50M of the sealing resin layer 50, thereby making it easy to form the re-distribution pattern.

In the embodiment, one type of resin (sealing resin) uniformly covers the surface of the package substrate. Accordingly, as opposed to a case that various types of resins having different thermal expansion coefficients or thermal shrinkage coefficients cover the surface, it is possible to easily prevent the resin from peeling off due to heat of re-flow (soldering) upon mounting the substrate.

After molding, the sealing resin may be ground from the front surface thereof, thereby reducing a thickness of the sealing resin layer. In this case, instead of the through electrodes, the terminals on the front surface side are formed on the substrate in advance, and the sealing resin layer is ground until the terminals on the front surface side are exposed. Accordingly, a burr may occur on an edge surface of the terminal on the front surface side, thereby causing poor connection upon mounting. When a burr occurs, it is necessary to add an etching step for removing the burr, thereby making the manufacturing process complicated.

In the embodiment, the through holes 32 are formed through the molding step, and the conductive material 34 is filled in the through holes 32 to form the through electrodes 36. Accordingly, it is possible to eliminate a burr, thereby making the manufacturing process simple.

A modification of the embodiment will be explained next. In the embodiment described above, the re-distribution pads 52 are formed on the backside surface of the double side electrode package 10. Further, connection terminals may be formed on the re-distribution pads 52. For example, a solder paste may be coated on the re-distribution pads 52 to form an LGA (Land Grid Array) type package, or solder balls may be disposed on the re-distribution pads 52 to form a BGA (Ball Grid Array) type package.

In the embodiment described above, the package substrate 12 is formed of the core member 16 with a flat plate shape; the wiring portions 20; the through electrodes 28; the connection pads 30; and the solder resist 42. Alternatively, the package substrate 12 may be formed of a multilayered organic substrate having a multilayered wiring portion. In multilayered organic substrate, a wiring pattern is formed in each of resin substrates formed of multi-layers (for example, two layers to four layers). If necessary, a via hole may be provided for connecting the wiring pattern in each layer. A conductive layer is formed in the via hole, and the conductive member is connected to a land formed on a lower surface side as an end surface electrode.

In the embodiment described above, one semiconductor chip 44 is disposed in one double side electrode package 10. Alternatively, a plurality of semiconductor chips may be disposed in one double side electrode package.

In the embodiment described above, the semiconductor chip 44 is connected through the flip-flop connection, and may be connected using a metal wire through wire bond connection.

In the embodiment described above, the through electrodes 28 have the circular column shape (same as that of the protruding portions 76 of the metal die 70), and may have a rectangular column shape. More specifically, when the through electrodes 28 (or the protruding portions 76) are cut in a plane in parallel to the surface of the package substrate 12 (the core member 16), the through electrodes 28 (or the protruding portions 76) may have a cross section having a circular outer circumferential shape such as circle, oval, and ellipse or a polygonal outer circumferential shape such as rectangle (square, rectangle, parallelogram, and diamond), pentagon, hexagon, heptagon, octagon, and the likes.

The disclosure of Japanese Patent Application No. 2007-185710, filed on Jul. 17, 2007, is incorporated in the application by reference.

While the invention has been explained with reference to the specific embodiments of the invention, the explanation is illustrative and the invention is limited only by the appended claims.

What is claimed is:

1. A semiconductor device comprising:
a package substrate having a front surface and a backside surface;
an electrode pad formed on the front surface;
an outer connection pad formed on the backside surface and electrically connected to the electrode pad;
a first through electrode formed in the package substrate for electrically connecting the electrode pad to the outer connection pad;
a semiconductor chip mounted on the front surface and having an electrode electrically connected to the electrode pad;
a sealing resin layer having a through hole formed with a die-molding and reaching the electrode pad for sealing the semiconductor chip; and
a second through electrode filled in the through hole with a conductive material and having one end portion disposed on the electrode pad and the other end portion exposed from the sealing resin layer,
wherein said first through electrode is situated just beneath the second through electrode or shifted inwardly from the second through electrode relative to a side edge of the package substrate,
said sealing resin layer has a plurality of through holes arranged in a pattern along an outer contour of the semiconductor chip so that a plurality of second through electrodes is filled in the plurality of through holes, and
said semiconductor chip is formed in a rectangular shape so that the plurality of second through electrodes is situated surrounding each side of the rectangular shape and at each corner of the rectangular shape.

2. The semiconductor device according to claim 1, further comprising a re-distribution pad formed on the sealing resin layer and a connection wiring portion formed on the sealing resin layer for electrically connecting the other end portion and the re-distribution pad.

3. The semiconductor device according to claim 1, wherein said plurality of second through electrodes are arranged in a rectangular area so that the first through electrode is situated within the rectangular area.

4. The semiconductor device according to claim 1, further comprising a solder resist formed on the backside surface so that the outer connection pad is disposed in the solder resist.

5. The semiconductor device according to claim 1, wherein said plurality of second through electrodes is formed in a circular cylindrical shape having a constant diameter from the one end portion to the other end portion.

* * * * *